United States Patent
Ravinuthula et al.

(10) Patent No.: US 12,032,036 B2
(45) Date of Patent: Jul. 9, 2024

(54) VOLTAGE CORRECTION IN BATTERY VOLTAGE MONITORS

(71) Applicant: TEXAS INSTRUMENTS INCORPORATED, Dallas, TX (US)

(72) Inventors: Vishnu Ravinuthula, Dallas, TX (US); Takao Oshida, Plano, TX (US); Geoffrey Grimmer, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 110 days.

(21) Appl. No.: 17/194,033

(22) Filed: Mar. 5, 2021

(65) Prior Publication Data

US 2021/0278474 A1  Sep. 9, 2021

Related U.S. Application Data

(60) Provisional application No. 62/985,754, filed on Mar. 5, 2020.

(51) Int. Cl.
*H02J 7/00* (2006.01)
*G01R 31/36* (2020.01)
(Continued)

(52) U.S. Cl.
CPC ....... *G01R 31/396* (2019.01); *G01R 31/3648* (2013.01); *H02J 7/0071* (2020.01); *H03M 1/44* (2013.01)

(58) Field of Classification Search
CPC . G01R 31/396; G01R 31/3648; H02J 7/0071; H02J 7/0021; H02J 7/007;
(Continued)

(56) References Cited

U.S. PATENT DOCUMENTS

| | | | |
|---|---|---|---|
| 2016/0056837 A1* | 2/2016 | Allen | H03K 19/017509 327/333 |
| 2016/0126970 A1* | 5/2016 | Xu | H03M 1/1245 341/120 |
| 2017/0120771 A1* | 5/2017 | Alser | G01R 31/3644 |

OTHER PUBLICATIONS

Texas Instruments, "AMC1306x Small, High-Precision, Reinforced Isolated Delta-Sigma Modulators With High CMTI," SBAS734C—Mar. 2017—Revised Jan. 2020, 44 p.

* cited by examiner

*Primary Examiner* — Alexander Satanovsky
*Assistant Examiner* — Trung Q Nguyen
(74) *Attorney, Agent, or Firm* — John R. Pessetto; Frank D. Cimino (57) ABSTRACT

An apparatus comprises a plurality of analog front ends (AFEs) adapted to be coupled to a plurality of battery cells and configured to decrease voltages received from the plurality of battery cells to produce a plurality of AFE voltages. The apparatus further comprises at least one analog-to-digital converter (ADC) coupled to the plurality of AFEs and configured to convert the plurality of AFE voltages to a plurality of corresponding digital signals. The apparatus also comprises a plurality of digital channel registers coupled to the at least one ADC and configured to store the plurality of digital signals, and a processor coupled to the at least one ADC and configured to adjust, in a round-robin calculation scheme, the plurality of digital signals based on a plurality of common mode voltage values and a plurality of common mode to differential gain values associated with the plurality of AFEs.

15 Claims, 7 Drawing Sheets

(51) Int. Cl.
 *G01R 31/396* (2019.01)
 *H03M 1/44* (2006.01)
(58) Field of Classification Search
 CPC ...... H02J 7/0014; H03M 1/44; H01M 10/425; H01M 10/482
 USPC ... 324/425–435, 500, 750.3, 757.04, 762.03, 324/600, 663, 671, 200, 207.13, 207.22, 324/239, 241, 515, 520, 530, 76.11, 324/105–124
 See application file for complete search history.

VOLTAGE CORRECTION IN BATTERY VOLTAGE MONITORS

CROSS-REFERENCE TO RELATED APPLICATIONS

The present application claims priority to U.S. Patent Application No. 62/985,754, filed Mar. 5, 2020 by Vishnu Ravinuthula et al., and titled "Correction of Common Mode to Differential Signal Conversion Errors," which is incorporated herein by reference in its entirety.

BACKGROUND

Batteries are useful to power electric systems in personal electronic devices, industrial devices, medical equipment, robots and automotive vehicles, such as cars and trucks. To meet the relatively high voltage demand in some systems (e.g., electric vehicles), multiple battery cells may be coupled in a stacked configuration. The output voltages of such battery cells may be monitored and regulated by battery voltage monitors to ensure proper operation and safety.

SUMMARY

An apparatus comprises a plurality of analog front ends (AFEs) adapted to be coupled to a plurality of battery cells and configured to decrease voltages received from the plurality of battery cells to produce a plurality of AFE voltages. The apparatus further comprises at least one analog-to-digital converter (ADC) coupled to the plurality of AFEs and configured to convert the plurality of AFE voltages to a plurality of corresponding digital signals. The apparatus also comprises a plurality of digital channel registers coupled to the at least one ADC and configured to store the plurality of digital signals, and a processor coupled to the at least one ADC and configured to adjust, in a round-robin calculation scheme, the plurality of digital signals based on a plurality of common mode voltage values and a plurality of common mode to differential gain values associated with the plurality of AFEs.

A method comprises converting, using at least one analog-to-digital converter (ADC), a plurality of differential voltage values from a plurality of analog front ends (AFEs) into a plurality of digital signals. The method also comprises updating, according to a round-robin calculation scheme, a plurality of common mode voltage values corresponding to the plurality of differential voltage values based on a plurality of previously obtained voltage values. The method also comprises calculating a plurality of common mode voltage error values based on a plurality of common mode to differential gain values associated with the AFEs and the updated common mode voltage values. The method also comprises adjusting the plurality of digital signals according to the plurality of common mode voltage error values, wherein the steps of updating the plurality of common mode voltage values, calculating the plurality of common mode voltage error values, and adjusting the plurality of digital signals are repeated in the round-robin calculation scheme.

BRIEF DESCRIPTION OF THE DRAWINGS

The same reference numbers are used in the drawings to designate the same or similar features (by structure and/or function).

DETAILED DESCRIPTION

Battery voltage monitors contain cell monitor units, which monitor battery cell output voltages to ensure proper operation and safety. Cell monitor units may include analog front end (AFE) circuitry that may decrease the battery cell output voltages to levels that may be safely and accurately monitored, and the cell monitor units also may include ADCs to digitize the decreased output voltages provided by the AFE. The process of decreasing the battery cell output using AFEs is commonly referred to as level shifting. The cell monitor units may be high-precision units that attempt to accurately monitor output voltages to within 1 millivolt (mV), which can be particularly useful in high-voltage applications (e.g., 12 volts (V) or more), where high-precision AFEs that are susceptible to small voltage variation levels are used. However, attempts to monitor the output voltages with such high precision are complicated by the fact that the AFE includes mismatched resistors. These mismatched resistors cause the common mode voltage of the AFE to affect (e.g., introduce error into) the decreased output voltages provided by the AFE. The common mode voltage is defined as the average voltage which is applied to the two inputs of the op-amp in the AFE. This error in the AFE output voltages complicates and often prevents the desired high-precision monitoring of battery cells.

This disclosure describes various examples of a cell monitor unit that includes digital correction logic to correct the common mode voltage error in the AFE output voltages described above. The example cell monitor unit may include multiple AFEs, a multiplexer coupled to the AFEs, an ADC coupled to the multiplexer, a demultiplexer coupled to the ADC, multiple channel registers coupled to the demultiplexer, and a processor coupled to the multiple channel registers. The AFEs decrease the battery cell output voltages to levels that may be safely and accurately monitored. The processor is configured to adjust, using a round-robin calculation scheme, multiple digital signals from the ADC that represent multiple decreased differential voltages from the AFEs based on a plurality of corresponding common mode voltage values stored in the channel registers and a plurality of precalculated common mode to differential gain values. The differential voltage corresponds to the difference between the two voltages applied to the inputs of the AFE. At the output of the AFE, the differential voltage is decreased with respect to the two input voltages. The decrease in the differential voltage is also referred to as level-shifting.

More specifically, the digital correction logic may be implemented using an ADC coupled to a plurality of AFEs corresponding to the battery cells. The AFEs may be resistor-based AFEs, capacitor-based AFEs, or other types of AFEs, examples of which are provided below. The ADC may convert the output voltages from the AFEs into respective digital signals, each representing a digital channel signal. Using a round-robin scheme, a digital correction may be applied in an iterative manner, where after correcting all channels in a current cycle, the correction is repeated for all channels in the next cycle using the values from the current cycle. The process may be repeated over multiple cycles in a round-robin fashion until all channels are corrected. The digital signal in each channel may be corrected based on a common mode to differential gain obtained for the channel. The common mode to differential gain for each channel may be obtained during a testing phase prior to implementing the correction scheme. For example, this process can be performed at the chip manufacturer's factory using automated test equipment. In this way, the common mode voltage-induced errors described above are reduced or eliminated.

Eliminating such errors improves the accuracy by which the battery cells may be monitored and regulated, and ensures proper operation and safety of the underlying system. For example, in applications related to automotive battery power systems, battery output voltage may be monitored according to high-precision demands for accuracy, e.g., within 1 mV of error, using the correction logic examples described herein. In such vehicles, there is a direct relationship between the accuracy of battery output voltage and the distance (e.g., mileage) over which the vehicle can be powered by the battery. A 1 mV error detected in battery output voltage may correspond to approximately 10 miles of uncertainty, which can be critical to a driver. Automotive vehicle manufacturers may compensate for higher uncertainty by adding more cells to the battery pack. Hence, by reducing the need for extra batteries by increasing the accuracy, system costs may be reduced. The improved accuracy may also reduce the time needed to perform system testing.

Figure 1A:
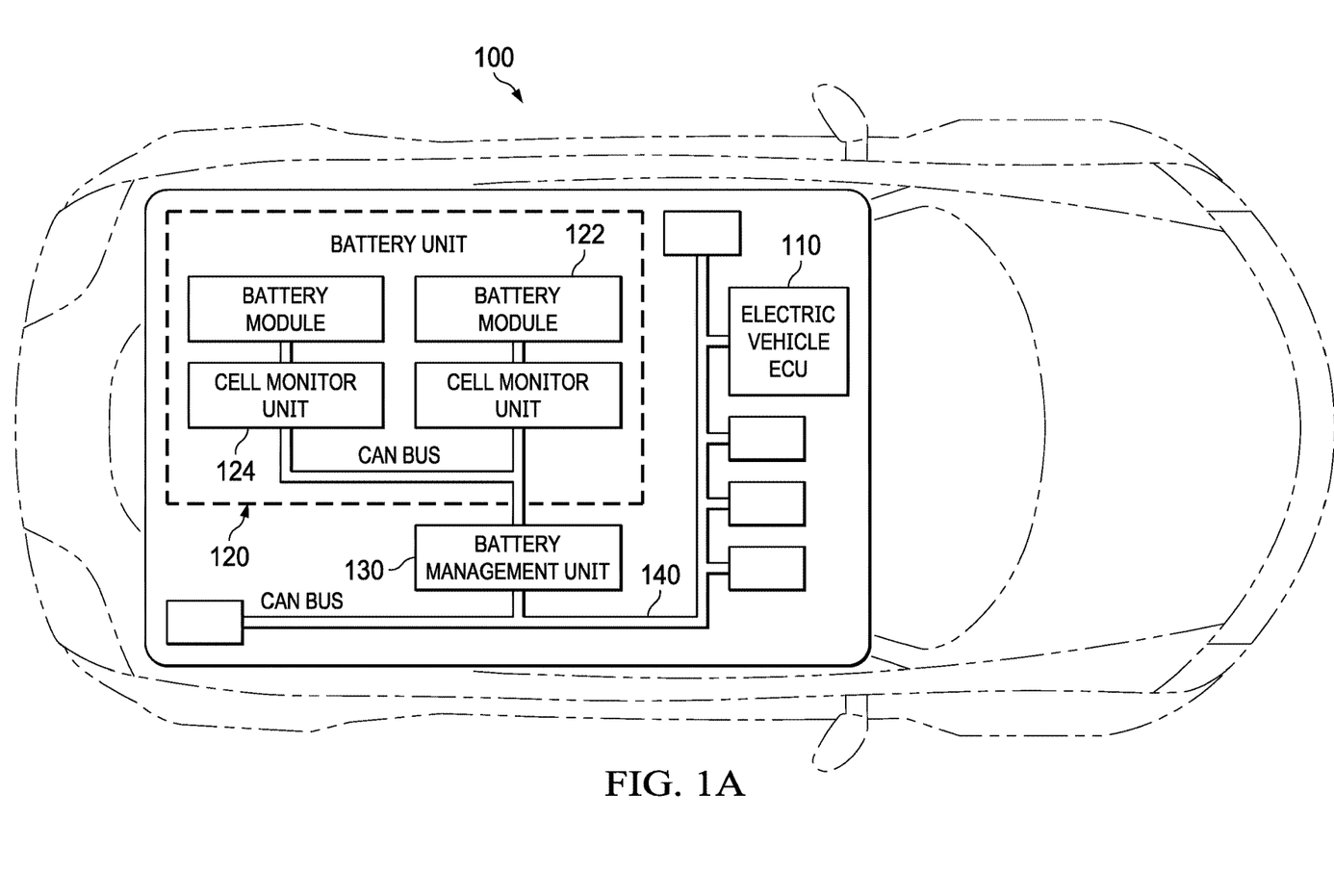
FIG. 1A is a schematic diagram of an automotive vehicle comprising a battery voltage monitor, in accordance with various examples.
Figure 1B:
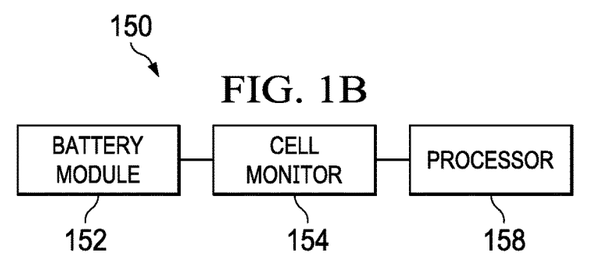
FIG. 1B is a schematic diagram of an apparatus comprising a battery voltage monitor, in accordance with various examples.

Various examples of the cell monitor unit are described with reference to the drawings. In particular, FIGS. 1A-1B depict an example system that may include a battery voltage monitor having a cell monitor unit. FIGS. 2-5 depict example AFEs (and properties of AFEs) that may be included in example cell monitor units. FIGS. 6-10 depict an example cell monitor unit and uses thereof.

FIG. 1A is a schematic diagram of an automotive vehicle comprising a battery voltage monitor, in accordance with various examples. Specifically, FIG. 1A illustrates an automotive vehicle 100 comprising an electric vehicle (EV) electronic control unit (ECU) 110, a battery unit 120, and a battery management unit 130 coupled to the EV ECU 110 and to the battery unit 120. The EV ECU 110, the battery unit 120, and the battery management unit 130 may be coupled to each other by way of a controller area network (CAN) bus 140 or other networking and/or bus structure. The automotive vehicle 100 may be any automotive vehicle that includes an electric engine powered by battery cells, or that includes other electric systems powered by battery cells. The battery voltage monitors described herein may find application beyond automotive vehicles. Other applications in which the battery voltage monitors described herein may be useful include personal electronics (e.g., smartphones, laptop computers, desktop computers, tablets, notebooks, artificial intelligence assistants), appliances (e.g., refrigerators, microwave ovens, toaster ovens, dishwashers), networking or enterprise-level electronics (e.g., servers, routers, modems, mainframe computers, wireless access points), avionics (e.g., aircraft, satellites, spacecraft), and numerous other electronic systems. The remainder of this description assumes application in automotive vehicles, but the scope of this disclosure is not limited to automotive vehicles.

The EV ECU 110 may be an embedded electronic system or circuitry that controls one or more of the electric systems or subsystems in the automotive vehicle 100, such as power, air conditioning, heating, radio, and electromechanical systems. The battery management unit 130 may be any electronic system or circuitry that manages the operation and charging of rechargeable battery units, such as the battery unit 120, and protects such battery units from operating outside target operating parameters. For instance, the battery management unit 130 may be an embedded controller system that manages and controls battery unit 120 voltage, current, and temperature levels for safe and proper operation. The battery management unit 130 may monitor the state of the battery unit 120, calculate battery output related data, and provide such data to the EV ECU 110. The CAN bus 140 may be configured according to a bus standard that enables microcontrollers and devices to communicate with each other and that is able to handle the voltage, current, and power used by such systems.

The battery unit 120 may comprise one or more battery modules 122, each coupled to a different cell monitor unit 124. Each battery module 122 may be a battery pack comprising a plurality of stacked battery cells. A battery cell is an electrochemical cell capable of generating electrical energy from chemical reactions. For example, the electrochemical cells may be voltaic cells or galvanic cells that generate an electric current. The battery cells may be connected in parallel, in series, or in a series-and-parallel configuration to deliver a target voltage, capacity, or power density. For instance, the battery module 122 may comprise 16 stacked battery cells, with each cell generating an output voltage of 4 V.

The cell monitor unit 124 may measure the output of the plurality of stacked cells in the corresponding battery module 122. The cell monitor unit 124 may be an integrated circuit (IC) that measures the total voltage of the stacked battery cells in the corresponding battery module 122, the voltages of the individual battery cells, or both. The cell monitor unit 124 may also measure the current and/or the temperature of the corresponding battery module 122 or the individual battery cells within the battery module 122, and the cell monitor unit 124 may determine useful values from such measurements, such as the average temperature of the battery module 122 or of the individual battery cells. The cell monitor unit 124 may also measure other electric parameters, such as the resistance or impedance of the battery cells. The data measured by each cell monitor unit 124 may be collected by the battery management unit 130. Thus, the battery management unit 130 may continuously obtain battery information from the cell monitor units 124 and may detect any critical battery fault and respond appropriately (e.g., by controlling battery cell balancing).

Voltage provided by stacked battery cells may be decreased to levels that are appropriate for safe and accurate cell monitoring. Although such decreases do not affect the equipment being powered by the battery cells, they do enable the cell monitor units 124 to safely and accurately monitor the output voltages of the battery cells. Such decreases may be achieved using AFEs.

FIG. 1B is a schematic diagram of an apparatus comprising a battery voltage monitor, in accordance with various examples. Specifically, FIG. 1B illustrates an apparatus 150 comprising a cell monitor unit 154 coupled to a battery module 152 and to a processor 158. The battery module 152 and the cell monitor unit 154 may deliver similar functionality (and may have the same structure) as the battery module 122 and the cell monitor unit 124 (in FIG. 1A), respectfully. The battery module 152 may comprise a battery cell or a plurality of stacked battery cells, which may be arranged in any suitable configuration to deliver a target voltage, capacity, or power density in the apparatus 150. The cell monitor unit 154 may measure the output of the battery cell and send the cell measurement data to the processor 158. The processor 158 may be any embedded system, such as a microcomputer, microcontroller or a central processing unit (CPU), configured to run operations and functions of the apparatus 150. The processor 158 may use the cell measurement data from the cell monitor unit 154 to ensure proper operations. The processor 158, the cell monitor unit 154, and the battery module 152 may be coupled to each other by way of a bus according to any suitable bus architecture of the apparatus 150. The apparatus 150 may be any electronic device requiring battery power (e.g., from the battery module). For example, the apparatus 150 may be a personal or mobile electronic device, e.g., a laptop computer, a desktop computer, a tablet, or a notebook. Alternatively, the apparatus 150 may be any appliance, server or enterprise-level equipment, or other electronic device using battery cells to power its components.

Figure 2:
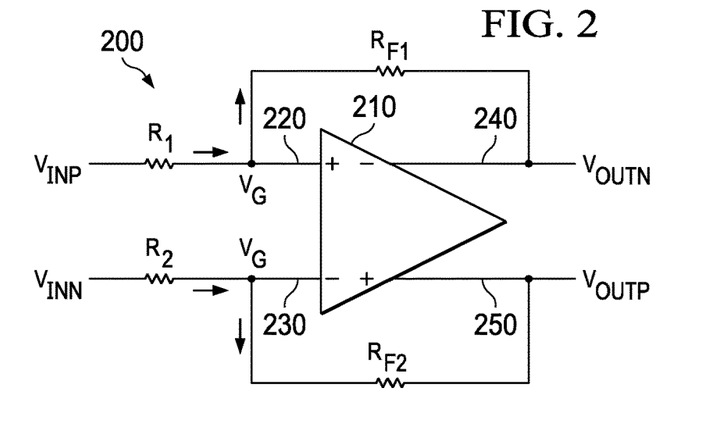
FIG. 2 is a schematic diagram of an AFE usable in battery voltage monitors, in accordance with various examples.

FIG. 2 illustrates an example AFE 200 that may be included in cell monitor units (e.g., cell monitor units 124 in FIG. 1A or the cell monitor unit 154 in FIG. 1B) and that may decrease the output voltage provided by the battery cells. In some examples, the AFE 200 may be coupled to an individual cell in a stack of battery cells. For example, the AFE 200 may be a component of the cell monitor unit 124 coupled to one of the battery cells in the corresponding battery module 122. In another example, the AFE 200 may be a component of the cell monitor unit 154 coupled to one of the battery cells in the corresponding battery module 152. The battery cells may be stacked, with the output of each battery cell coupled to the inputs of a corresponding AFE 200 among a stack of parallel AFEs. The connection between a battery cell and its corresponding AFE is referred to herein as a channel. The AFE 200 is configured to provide an output voltage that is lower than the voltage received from a corresponding battery cell. In some examples, the AFE 200 may comprise an op-amp 210 having two inputs 220 and 230 and two outputs 240 and 250. The inputs 220 and 230 are coupled to resistors $R_1$ and $R_2$, respectively. The input 220 is coupled to the output 240 by way of a resistor $R_{f1}$, and the input 230 is coupled to the output 250 by way of a resistor $R_{f2}$. The AFE 200 may provide a differential output voltage $V_{outp}-V_{outn}$ that is reduced with respect to the differential input voltage received by the AFE 200 according to equation (1):

$$V_{outp} - V_{outn} = V_g\left(\frac{R_{f2}}{R_2} - \frac{R_{f1}}{R_1}\right) + V_{inp}\frac{R_{f1}}{R_1} - V_{inn}\frac{R_{f2}}{R_2} \quad (1)$$

Ideally, the relationship between the differential output, $V_{outp}-V_{outn}$, and the inputs, $V_{inp}$ and $V_{inn}$, would depend only on the values of the resistors $R_1$, $R_2$, $R_{f1}$ and $R_{f2}$. However, due to the mismatch in resistor values in practical implementation, the amplifier input pin voltage term, $$V_g\left(\frac{R_{f2}}{R_2} - \frac{R_{f1}}{R_1}\right),$$

is present in the output and affects the precision with which the battery cells are monitored. The op-amp 210 is configured to force the positive amplifier input (220) voltage and the negative amplifier input (230) voltage, at the two inputs of the op-amp 210, to be at about the same voltage level. Equation (1) shows that if $$\frac{R_{f2}}{R_2} \cong \frac{R_{f1}}{R_1}$$

then the amplifier input voltage term becomes negligible. The amplifier input voltage, $V_g$, can be evaluated by:

$$V_g = \left[\left(\frac{V_{inp} + V_{inn}}{2} - 2.5\right)\frac{R_{f1}}{R_{f1} + R_1}\right] + 2.5 \quad (2)$$

The term $$\frac{V_{inp} + V_{inn}}{2}$$

in equation (2) is referred to herein as the common mode voltage, $V_{CM-INP}$. The cell monitor units (e.g., cell monitor units 124 in FIG. 1A or the cell monitor unit 154 in FIG. 1B) described herein are configured to correct for this error in the differential output voltage of the AFE 200.

Figure 3:
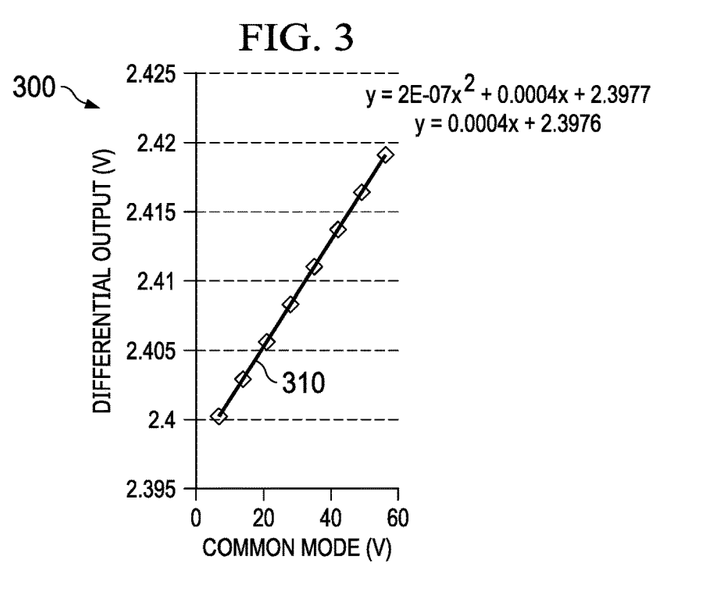
FIG. 3 is a graph illustrating a relationship of common mode voltage and output voltage for an AFE in a battery voltage monitor, in accordance with various examples.

FIG. 3 shows a graph 300 that plots common mode voltages $V_{CM-INP}$ in volts (x-axis) against differential output voltages $V_{outp}-V_{outn}$ in volts (y-axis) for the example AFE 200 of FIG. 2. The graph 300 shows a linear relationship between the differential voltage output, $V_{outp}-V_{outn}$, and the common mode voltage, $V_{CM-INP}$. For example, if $V_{CM-INP}$ changes from 32 V to 28 V, a 1.6 mV variation in the differential voltage output, $V_{outp}-V_{outn}$, is expected. The data can be expressed by the second order function $y=Ax^2+Bx+C$, where A, B, and C are constants that can determined by a curve fit procedure on the data. In a configuration, such as shown in FIG. 2, A ($2\times10^{-7}$) and B (0.0004) are determined based on the curve fit result for the measured $V_{CM-INP}$ and $V_{outp}-V_{outn}$ of the AFE 200, and C (2.3976) is determined as the offset in the data. The resulting function $y=2\times10^{-7}x_2+0.0004x+2.3976$ may be approximated by the linear relationship $y=0.0004x+2.3976$, as represented by the straight line 310. This relationship between the common mode voltage and the differential voltage output demonstrates the effect that the common mode voltage has on the differential voltage output of the AFE 200. As explained above, it is undesirable for the common mode voltage to affect the differential output voltage of the AFE 200, and example cell monitor units (e.g., cell monitor units 124 in FIG. 1A and cell monitor unit 154 in FIG. 1B) described herein correct this error.

Figure 4:
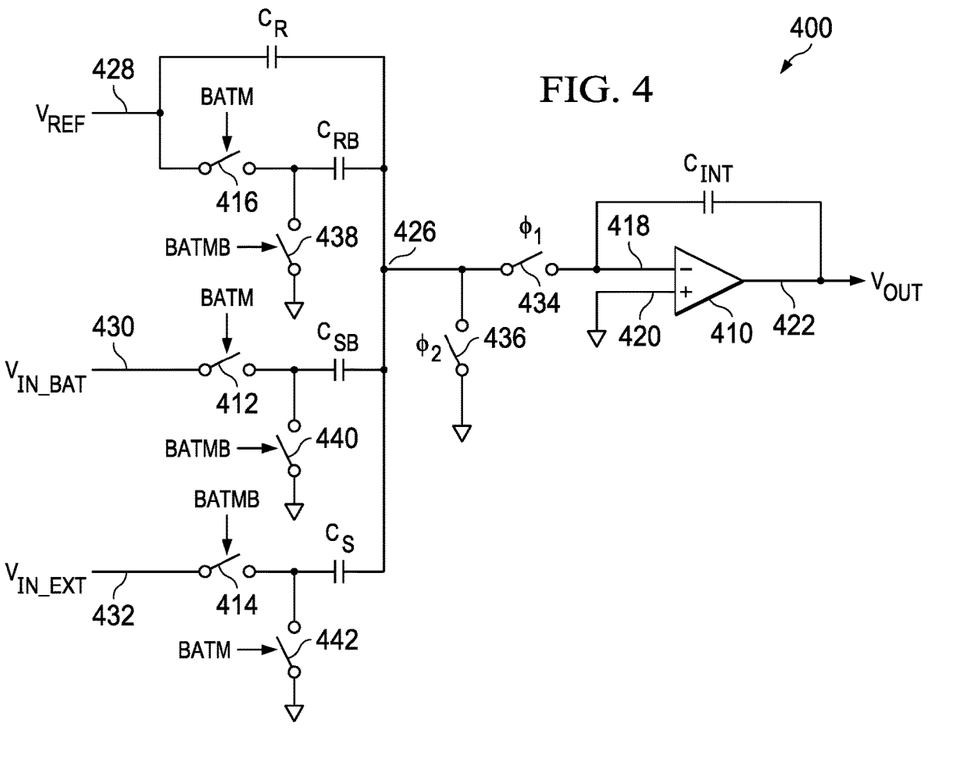
FIG. 4 is a schematic diagram of an AFE in a battery voltage monitor, in accordance with various examples.

FIG. 4 is a schematic diagram of an example AFE 400 that is useful to decrease the output voltage provided by one or more battery cells. In some examples, the AFE 400 may be coupled to an individual cell in a plurality of stacked battery cells. For instance, the AFE 400 may be a component of the cell monitor unit 124 (or the cell monitor unit 154) coupled to one of the battery cells in the battery module 122 (or the battery module 152). The AFE 400 is configured to provide an output voltage that is lower than the input voltage provided by a corresponding battery cell. Unlike the AFE 200, which is resistor-based, the AFE 400 is capacitor-based. The AFE 400 may include an op-amp 410 having inputs 418 and 420 and an output 422. The input 420 is coupled to ground. The input 418 and the output 422 are coupled to each other by way of a capacitor $C_{INT}$. The input 418 is coupled to a node 426 by way of a switch 434, and the node 426 is coupled to ground by way of a switch 436. The node 426 is coupled to capacitors $C_R$, $C_{RB}$, $C_{SB}$, and $C_S$. An AFE input 428 ($V_{REF}$) is coupled to the capacitor $C_R$. The input 428 is coupled to the capacitor $C_{RB}$ by way of a switch 416. The capacitor $C_{RB}$ is coupled to ground by way of a switch 438. An AFE input 430 ($V_{IN\_BAT}$) is coupled to the capacitor $C_{SB}$ by way of a switch 412. The capacitor $C_{SB}$ is coupled to ground by way of a switch 440. An AFE input 432 ($V_{IN\_EXT}$) is coupled to the capacitor $C_S$ by way of a switch 414. The capacitor $C_S$ is coupled to ground by way of a switch 442. Switch 434 is controlled by a signal $\Phi_1$ and switch 436 is controlled by a signal $\Phi_2$. The switch 416 is controlled by a signal BATM, and the switch 438 is controlled by a signal BATMB, which is the inverse of BATM. The switch 412 is controlled by BATM, and the switch 440 is controlled by BATMB. The switch 414 is controlled by BATMB, and the switch 442 is controlled by BATM. The switches 412, 414, 416, 434, 436, 438, 440, 442 may be controlled by a processor (not shown) coupled to the cell monitor comprising the AFE 400, for example the processor 158 (of FIG. 1B), the battery management unit 130 (of FIG. 1A) or the EV ECU 110 (of FIG. 1A).

Figure 5:
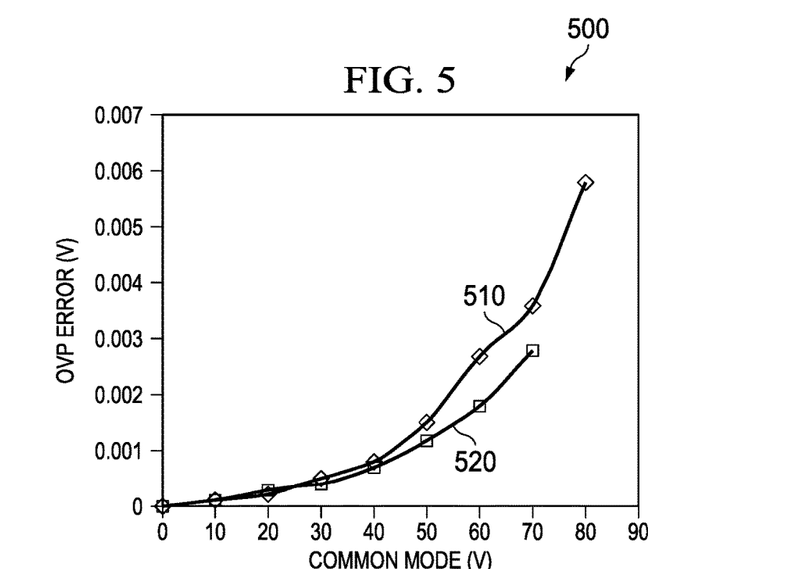
FIG. 5 is a graph illustrating a relationship of common mode voltage and output voltage error for an AFE in a battery voltage monitor, in accordance with various examples.

FIG. 5 is a graph 500 that depicts measured data values (y-axis) of error in the output voltage $V_{out}$ of the AFE 400 (FIG. 4), referred to as output voltage (OVP) error, over a range of values for common mode voltage $V_{CM-INP}$ (x-axis). The common mode voltage is calculated as $$V_{CM-INP} = \frac{V_{inp} + V_{inn}}{2},$$

where $V_{inn}$ and $V_{inp}$ are the voltages at the inputs 418 and 420 of the op-amp 410, respectively. The data is measured for two OVP levels, represented by a first curve 510 for an output voltage of 6.375 V, and a second curve 520 for an output voltage of 4.820 V. The graph 500 shows a quasi-linear relationship between output voltage error and common mode voltage. The graph 500 demonstrates that the common mode voltage affects the output voltage of the AFE 400, that OVP error is exacerbated with increasing levels of common mode voltage, and that the latter effect is amplified at higher output voltages. The example cell monitor units (e.g., cell monitor units 124 in FIG. 1A and cell monitor unit 154 in FIG. 1B) of some of the example embodiments are configured to correct such error.

Figure 6:
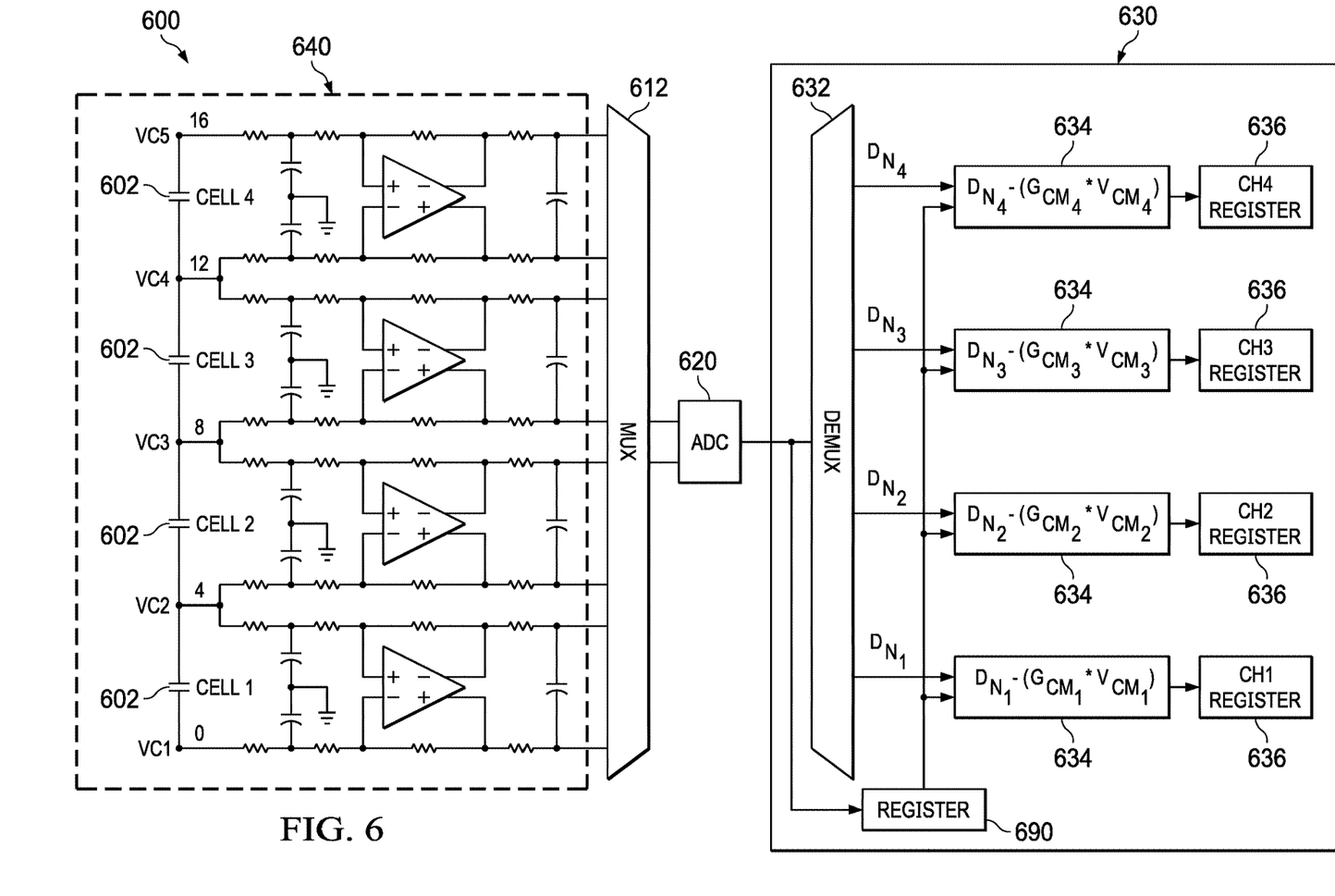
FIG. 6 is a schematic diagram of digital correction circuitry for correcting an AFE output voltage, in accordance with various examples.

FIG. 6 illustrates a cell voltage monitor circuit 600 in accordance with various examples. The example cell voltage monitor circuit 600 may be part of a cell monitor unit, such as the cell monitor unit 124 or the cell monitor unit 154 (FIG. 1A and FIG. 1B) described above. The cell monitor circuit 600 may include a plurality of AFEs configured to decrease the output voltage provided by the battery cells. The cell voltage monitor circuit 600 may be configured to implement a round-robin error correction scheme on a plurality of digital channels corresponding to output voltages from a plurality of stacked battery cells. The cell voltage monitor circuit 600 may include an ADC 620 coupled to a multiplexer (MUX) 612 and to a digital boundary 630. The ADC 620 may be a successive approximation register (SAR) ADC, for instance with 16-bit effective number of bits (ENOB) registers. In examples, the ADC 620 may be a sigma-delta ADC. A plurality of AFEs 640 (e.g., four AFEs are illustrated in FIG. 6 as circuitry 640) are coupled to an input end of the MUX 612. As shown in FIG. 6, for the case of 4 V battery cells, the input voltages to the AFEs 640 range from 0 V in 4 V increments for each next battery cell in the stack (e.g., 0 V, 4 V, 8 V, etc.). In some examples, the number of battery cells supported may range from one battery cell up to 24 battery cells. In FIG. 6, one or more battery cells are represented by each capacitor 602 (a plurality of capacitors 602 are shown in FIG. 6 to illustrate multiple battery cells) coupled to the corresponding AFEs 640. Although FIG. 6 shows a plurality of resistor-based AFEs 640, in other examples, the MUX 612 may be coupled to a plurality of capacitor-based AFEs, or any suitable type of AFEs. The digital boundary 630 may comprise a demultiplexer (DEMUX) 632 coupled to the ADC 620 and to a processor or other control logic represented by the plurality of modules 634. The MUX 612 and the DEMUX 632 are controlled by the processor (or other control logic or processing device) by way of control signals to operate properly as intended. Each of the plurality of modules 634, in turn, may be coupled to a digital channel register 636 or modules 634 may be coupled to one or more memories or flip-flops.

The MUX 612 is configured to multiplex the output voltages (e.g., differential output voltages) from the AFEs 640 into the ADC 620, where each differential output voltage is converted, for example into a corresponding 16-bit digital signal. The digital signal provided by the ADC 620 is demultiplexed by DEMUX 632 to digital channel signals ($Dn_1$, $Dn_2$, $Dn_3$ ... $Dn_k$). The DEMUX 632 provides the demultiplexed digital channel signals to the respective modules 634.

The modules 634 modify the digital channel signals to remove the above-described common mode voltage error. Specifically, for each digital channel k, the common mode voltage error, $G_{cm_k} \times V_{cm_k}$, may be calculated and then subtracted from the corresponding digital signal $Dn_k$. A scheme may be used as described below (with reference to FIG. 8) to obtain the common mode to differential gain $G_{cm_k}$ (e.g., calculating these values during test at a device production facility or at some other time/place) and the common mode voltage $V_{cm_k}$ may be determined using a round-robin scheme over multiple cycles, in which the channel signal values obtained for the channels in each cycle are used to calculate the common mode voltage values for each channel in the next cycle. The determination of these two values are described below with reference to FIGS. 7 and 8. After the digital channel signals have been corrected to remove the common mode voltage error, the resulting corrected digital channel signal may be stored in the respective digital channel registers 636 and used by a battery voltage monitor (e.g., the battery management unit 130 of FIG. 1A) as may be appropriate. The ADC 620 may comprise or may be coupled to a dedicated storage device 690 (e.g., a register) configured for accumulating the output from the ADC 620 in a digitized form. The accumulated ADC output is used in the round-robin scheme to calculate the common mode voltage for each digital channel, as described below.

In some examples, digital correction for AFE output voltages may be implemented using any suitable digital correction circuitry that includes an ADC and multiple registers. Any suitable ADC, such as a SAR or sigma-delta ADC, may be used. In some examples, the digital correction circuitry may be implemented by positioning the ADC between the AFEs and the digital channel registers without using a MUX and a DEMUX. In such examples, the ADC may comprise a plurality of inputs coupled to the outputs of the AFEs and a plurality of outputs coupled to the digital channel registers. In other examples, a plurality of ADCs may be positioned between the AFEs and the corresponding digital channel registers without the need to multiplex and demultiplex the digital channel signals. In this case, each individual ADC corresponds to a digital channel.

Figure 7:
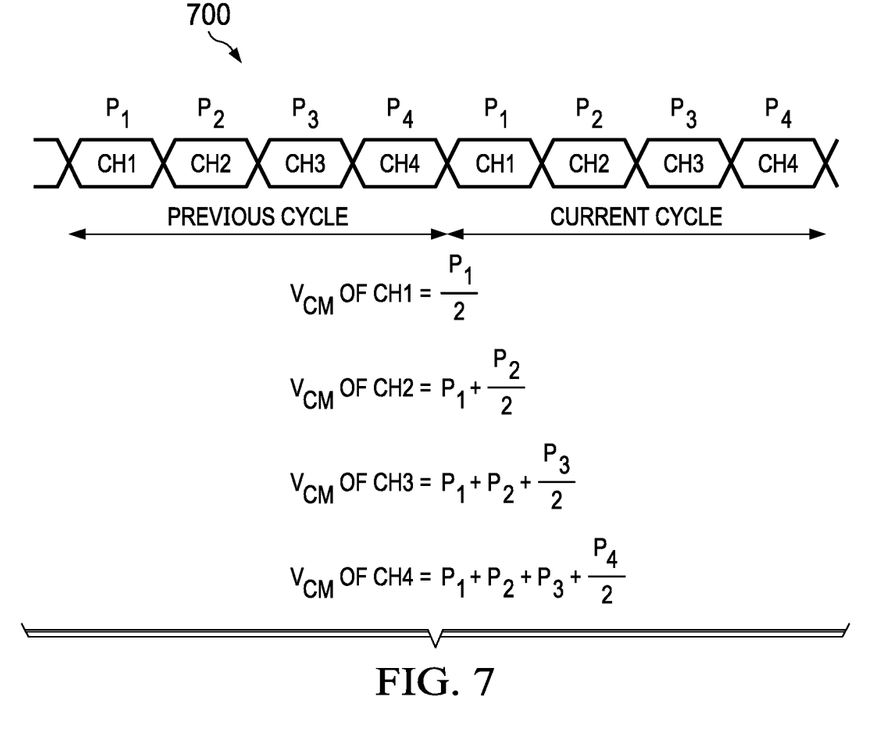
FIG. 7 is a schematic diagram of a round-robin correction scheme for an AFE output voltage, in accordance with various examples.

FIG. 7 illustrates an example round-robin correction scheme 700 that may be used to calculate the common mode voltage $V_{cm_k}$, for instance in the cell voltage monitor circuit 600, to digitally correct common mode voltage error. The round-robin correction scheme 700 may be implemented over a plurality of calculation cycles in an iterative manner until the values in the calculations converge. At any current cycle of round-robin calculations, the stored digital channel signal values from the preceding cycle may be fetched from the corresponding digital channel registers 636 and used to calculate differential voltage values for the respective digital channels in the current cycle. For example, the previously stored values, $P_1$ to $P_4$, for channels CH1 to CH4 may be used to calculate the respective common mode voltage $V_{cm}$ values for the same channels according to the following:

$$V_{cm_1} = \frac{P_1}{2} \quad (3a)$$

$$V_{cm_2} = P_1 + \frac{P_2}{2} \quad (4a)$$

$$V_{cm_3} = P_1 + P_2 + \frac{P_3}{2} \quad (5a)$$

$$V_{cm_4} = P_1 + P_2 + P_3 + \frac{P_4}{2} \quad (6a)$$

During the initial cycle, the digital values provided by the ADC 620 may be stored in the corresponding digital channel registers 636 without correction. As the iterative round-robin scheme progresses over time, the common mode voltage calculation and hence the resulting error correction becomes more accurate, as the values from the previous cycles improve the error calculation for subsequent cycles.

In equations (3a) to (6a) above, $V_{cm_k}$ for each channel k (where k is 1, 2, 3 or 4, above) represents the common mode voltage value at the current round-robin cycle, and $P_k$ represents the voltage values calculated in the previous cycle. The common mode voltage value at the current cycle, $V_{cm_k}$, can be calculated based on the channel voltage information of the previous round-robin cycle. This implementation may be used in different embodiments of the cell voltage monitor circuit described herein. For example, the equations can be used in a cell voltage monitor design where individual ADCs are coupled to the AFEs and the corresponding digital registers. The equations may also be used in in the case of a multiplex/demultiplex pair coupled to a single ADC component, such as in the cell voltage monitor circuit 600.

In another embodiment, where a multiplexer/demultiplexer pair is used, e.g., the cell voltage monitor circuit 600, another round-robin calculation scheme may be used where each channel is corrected before the next channel in order in the sequence of ascending channels, according to the following:

$$V_{cm_1} = \frac{C_1}{2} \quad (3b)$$

$$V_{cm_2} = C_1 + \frac{C_2}{2} \quad (4b)$$

$$V_{cm_3} = C_1 + C_2 + \frac{C_3}{2} \quad (5b)$$

$$V_{cm_4} = C_1 + C_2 + C_3 + \frac{C_4}{2} \quad (6b)$$

In equations (3b) to (6b) above, $C_k$ represents the calculated voltage value for channel k (where k is 1, 2, 3 or 4, above) in the current round-robin calculation cycle. In this implementation, the common mode voltage, $V_{cm_k}$, is calculated based on the channel voltage information of the same cycle without using the voltage values calculated in the previous round-robin cycle.

For example, considering a sequence of four channels, CH1 to CH4, for four battery cells, the common mode voltage calculation is performed in sequence starting with CH1 and moving on to the next channels. After CH4 calculation, the sequence returns to CH1 calculation in a round-robin manner. At each sequence, the ADC output is accumulated, e.g., in the ADC dedicated register 690, and the accumulated value is used to obtain the common mode voltage. The ADC register is initially reset to 0 prior to starting the process. The ADC output for CH1, $Dn_1$, is then stored in the ADC register. This value is used to calculate the common mode for CH1, $V_{cm_1}$, according to equation (3b). Next, the ADC output for CH2, is added to the value in the register, resulting in an accumulated value, $Dn_1+Dn_2$. The accumulated value is then used to calculate the common mode for CH2, $V_{cm_2}$, according to equation (3b). The steps are repeated for CH3 and CH4. After the common mode voltages are calculated for all the considered channels, the register is reset to 0, and the sequence returns to the first channel in a round-robin manner. The correction steps at each sequence are shown in Table 1 below.

TABLE 1

| Selected Channel | ADC output | Register output | Vcm |
|---|---|---|---|
| CH1 | Dn1 | 0 | Dn1/2 |
| CH2 | Dn2 | Dn1 | Register + Dn2/2 |
| CH3 | Dn3 | Dn1 + Dn2 | Register + Dn3/2 |
| CH4 | Dn4 | Dn1 + Dn2 + Dn3 | Register + Dn4/2 |
| CH1 | Dn1 | 0 | Dn1/2 |
| CH2 | Dn2 | Dn1 | Register + Dn2/2 |
| CH3 | Dn3 | Dn1 + Dn2 | Register + Dn3/2 |

TABLE 1-continued

| Selected Channel | ADC output | Register output | Vcm |
|---|---|---|---|
| CH4 | Dn4 | Dn1 + Dn2 + Dn3 | Register + Dn4/2 |
| CH1 | Dn1 | 0 | Dn1/2 |
| ... | ... | ... | ... |

Figure 8:
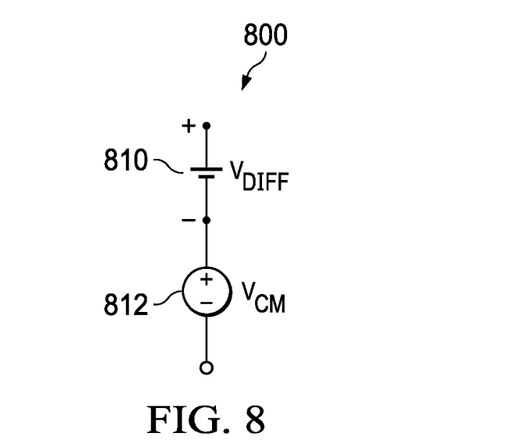
FIG. 8 is a schematic diagram of a measurement scheme useful for obtaining common mode to differential gain for a channel output voltage, in accordance with various examples.

FIG. 8 illustrates a measurement scheme 800 for calculating the common mode to differential gain $G_{cm_k}$ for an AFE, according to various examples. The measurement scheme 800 may be performed at the chip manufacturer's factory, for example using automated test equipment. The gain $G_{cm_k}$ may be obtained similarly for each channel in the cell voltage monitor circuit 600 (FIG. 6). The measurement scheme 800 may be used in case of a linear or near-linear relationship between the common mode voltage error and the differential output voltage of the AFE, e.g., as shown in FIG. 3. Specifically, a common mode voltage, $V_{cm}$, is applied to each battery cell, represented by a capacitor 810, for each signal channel by way of a voltage source 812. The capacitor 810 in FIG. 8 corresponds to the capacitor 602 in FIG. 6. The voltage source 812 may be connected to each battery cell as shown to apply a common mode voltage value to each corresponding signal channel. For each battery cell used in the stack of battery cells, two different values, $x_1$ and $x_2$, of the common mode voltage $V_{cm}$, are applied. For each applied value, the resulting digital channel signal at the corresponding digital channel register, e.g., digital channel register 636, is measured. Thus, two digital channel signals, $y_1$ and $y_2$, corresponding to the two applied $V_{cm}$ values, $x_1$ and $x_2$, are obtained at the digital channel register 636. The battery cell maintains its differential output voltage value, $V_{DIFF}$, during the process. In one example, $V_{DIFF}$ is kept equal to 4 V while changing the values of $V_{cm}$ from $x_1$ to $x_2$. The amplifier input voltage at the op-amp of the AFE may be set to a known value, for instance 1 V. This simplifies the calculations based on the relationship between $V_g$ and $V_{DIFF}$ in equation (1) above, where $V_{DIFF}=V_{outp}-V_{outn}$. As such, the common mode to differential gain may be calculated and then digitized according to the following:

$$\text{gain}_{cm} = \left(\frac{y_2 - y_1}{x_2 - x_1}\right) \tag{7}$$

$$G_{cm} = -\text{gain}_{cm} \cdot 2^{16} \tag{8}$$

The term $2^{16}$ in equation (8) corresponds to converting $G_{cm}$ into a digital value of 16 bits. In other examples, the digital values may be obtained for other bit lengths as required by the application. The gain calculation scheme may be implemented for each channel in the cell voltage monitor circuit 600 by the modules 634 to obtain a digitized value of the common mode to differential gain $G_{cm_k}$ for each channel k. The $G_{cm_k}$ values may be stored in a memory of the system and used subsequently during the correction of AFE common mode voltage error as described below.

In an embodiment, the relationship between the common mode voltage error and the differential output voltage of the AFE may be a non-linear relationship, e.g., as seen in FIG. 5 for a capacitor-based AFE. In this case, a quadratic function or curve may be used to obtain the common mode to differential gain $G_{cm}$. The curve may be obtained by applying three different values, $x_1$, $x_2$, and $x_3$, of the common mode voltage $V_{cm}$, and collecting three corresponding digital channel signals in the respective digital channel registers (e.g., digital channel registers 636). Thus, three digital channel signals, $y_1$, $y_2$, and $y_2$ are obtained. The applied and measured values are then used to construct the curve representing the non-linear relationship. A second order or higher order curve fit may be calculated accordingly using quadratic coefficients. The quadratic coefficients are then stored and used in the digital correction of AFE common mode voltage error.

Figure 9:
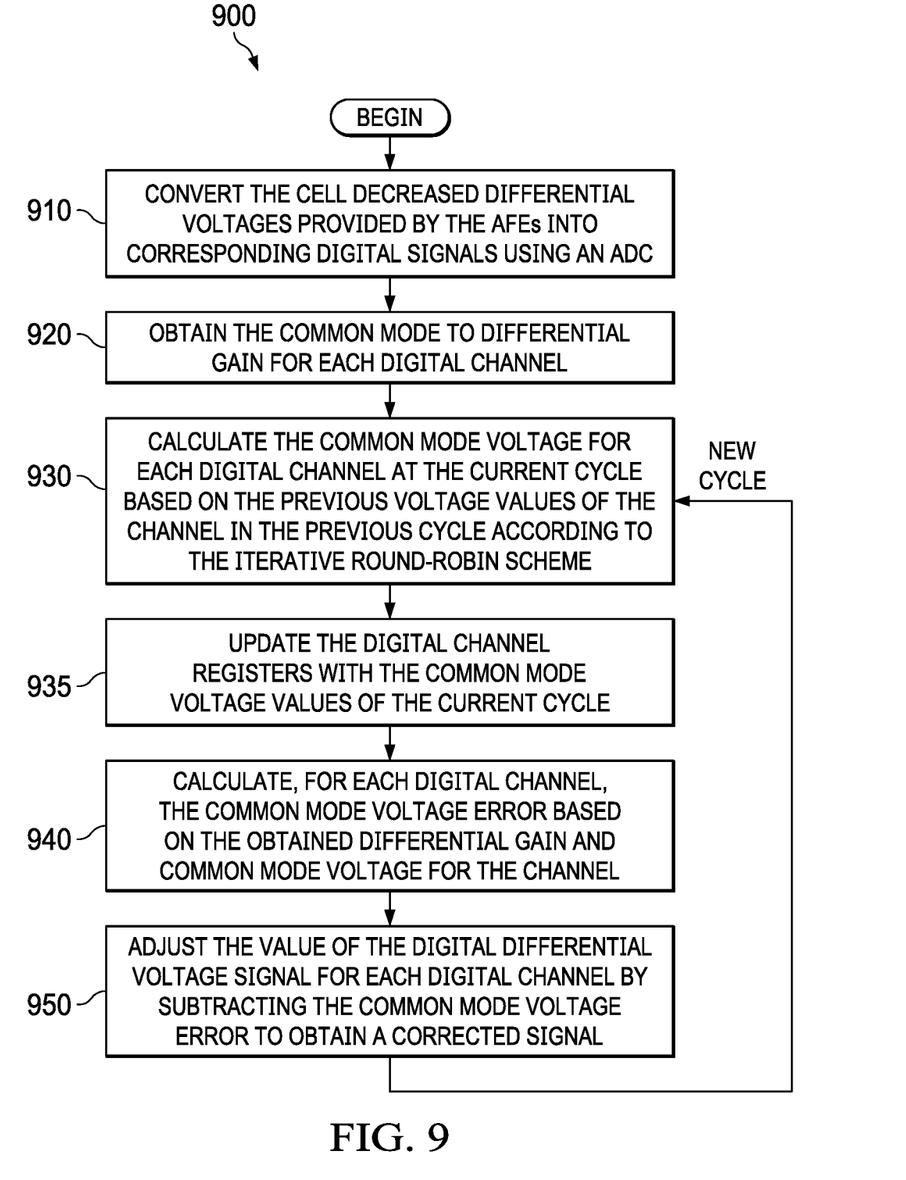
FIG. 9 is a flow diagram of a method for digitally correcting AFE output voltage errors, in accordance with various examples.

FIG. 9 illustrates a flow diagram of a method 900 for digital correction of AFE common mode voltage error according to various examples. The method 900 implements digital correction for a plurality of digital channels. For instance, the method 900 may be implemented using the cell voltage monitor circuit 600 to adjust the digital output signal, $Dn_k$, for each digital channel k by accounting for the common mode voltage error, $G_{cm_k} \times V_{cm_k}$, and hence obtain a corrected signal $Dn_k^*$ according to:

$$Dn_k^* = Dn_k - G_{cm_k} \times V_{cm_k} \tag{9}$$

The method 900 may begin at step 910, where the decreased differential voltages from the AFEs are converted into corresponding digital signals using an ADC. For instance, the step 910 may be implemented by a SAR ADC 620 where the output voltages provided by the parallel AFEs 640 are digitized and stored in ADC channel registers 636. At step 920, the common mode to differential gain for each digital channel is obtained, for instance from a memory or storage. The common mode to differential gain values for all digital channels may be previously calculated at a test phase of the system and stored. For instance, the common mode to differential gain $G_{cm_k}$ for each digital channel may be calculated using the measurement scheme 800 as described above. At step 930, the common mode voltage for each digital channel may be calculated at a current cycle based on previously stored voltage values of the digital channel, which are calculated in the previous cycle according to the iterative round-robin scheme described above. For instance, the common mode voltage $V_{cm_k}$ for each digital channel may be calculated using a round-robin set of equations similar to the pattern shown in equations (3a) to (6a). As described above, the value for each digital channel in a current cycle is based on the values of the same digital channel and all lower digital channels in the previous cycle, which may be stored in corresponding registers, e.g., the digital channel registers 636. At step 935, the digital channel registers are updated with the common mode voltage values of the current cycle. At step 940, the common mode voltage error, $G_{cm_k} \times V_{cm_k}$, is calculated for each digital channel based on the obtained differential gain and common mode voltage for the channel. At step 950, the value of the digital differential voltage signal is adjusted for each digital channel by subtracting the common mode voltage error to obtain a corrected signal (e.g., using equation (9)). The foregoing actions and calculations may be implemented using a processor or controller in a cell monitor unit for the battery cells (e.g., cell monitor unit 124 in FIG. 1A or cell monitor unit 154 in FIG. 1B). The method 900 returns to step 930 to implement a next cycle of the round-robin scheme described above, until the method is ended by the processor or controller.

Figure 10:
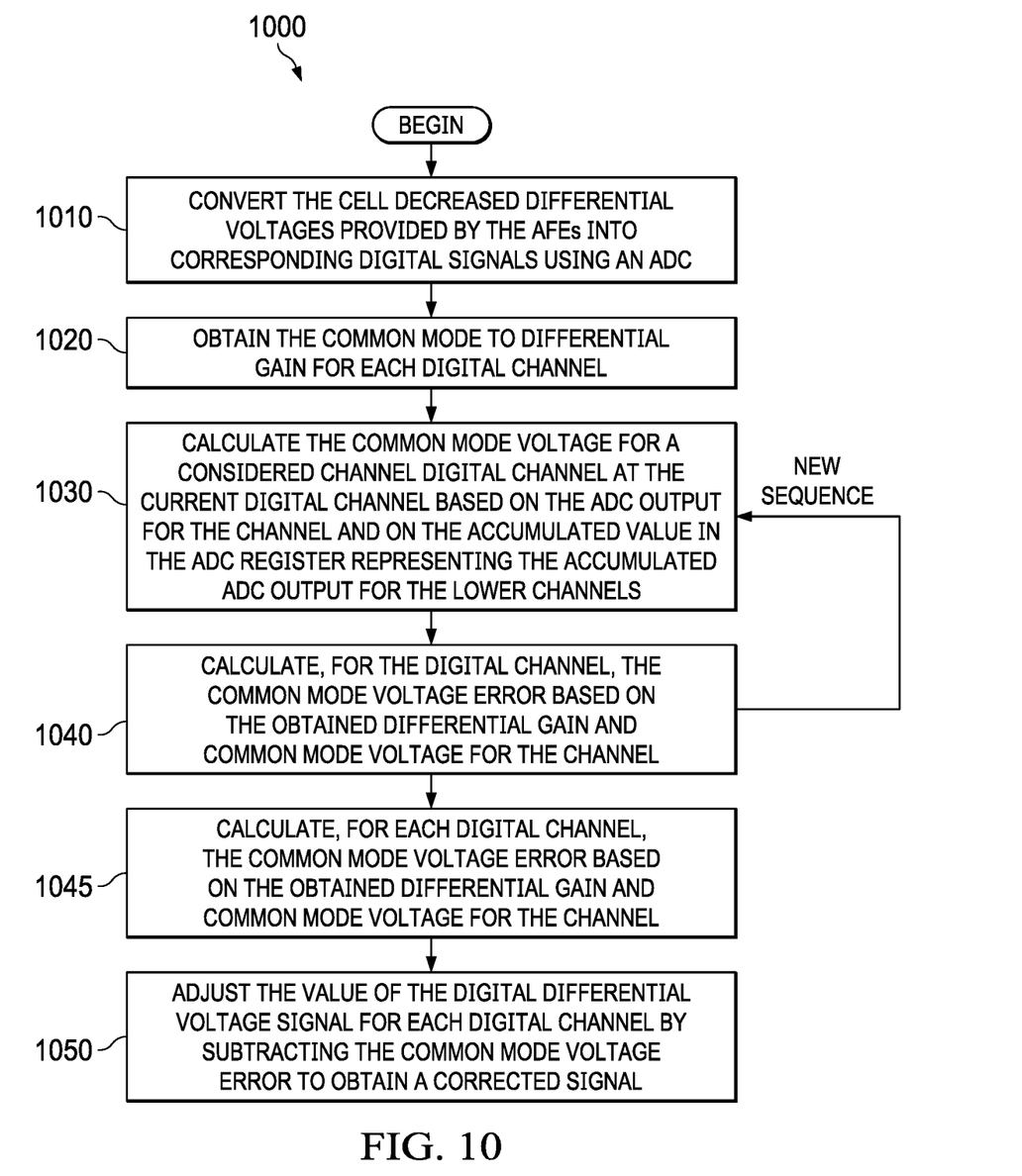
FIG. 10 is a flow diagram of another method for digitally correcting AFE output voltage errors, in accordance with various examples.

FIG. 10 illustrates a flow diagram of another method 1000 for digital correction of AFE common mode voltage error according to various examples. The method 1000 may be implemented using the cell voltage monitor circuit 600, where the correction is performed in the sequential order of the digital channels with ascending differential voltage values. To obtain the common mode voltage values for each channel in the sequence, an ADC dedicated register, e.g., the dedicated register 690, may be used to accumulate the ADC output. Initially, at step 1010, the decreased differential voltages from the AFEs are converted into corresponding digital signals using the ADC. At step 1020, a previously calculated common mode to differential gain for each digital channel is obtained from a memory or storage. The common mode to differential gain may be previously calculated using the measurement scheme 800. At step 1030, the common mode voltage for a considered digital channel may be calculated based on the ADC output for the channel and the accumulated value in the ADC register. The accumulated value in the ADC register represents the accumulated ADC output for the lower channels. For instance, the common mode voltage $G_{cm_k}$ for channel k may be calculated using the ADC output for this channel, $Dn_k$, and the accumulated output values in the ADC register for the lower channels, as shown in equations (3b) to (6b). At step 1040, the common mode voltage error, $G_{cm_k} \times V_{cm_k}$, is calculated for the digital channel based on the obtained differential gain and common mode voltage for the channel. The method 1000 returns to step 1030 to process the next channel in the sequence of channels. The ADC register is reset to 0 after reaching the last channel in the sequence, before repeating the steps. The foregoing actions and calculations may be implemented using a processor or controller in a cell monitor unit for the battery cells (e.g., cell monitor unit 124 in FIG. 1A or cell monitor unit 154 in FIG. 1B). Steps 1030 and 1040 are repeated in a round-robin scheme, until the steps are ended by the processor or controller. At step 1045, the common mode voltage error is calculated for each digital channel based on the obtained differential gain and common mode voltage for the channel. At step 1050, the value of the digital differential voltage signal for each digital channel is adjusted by subtracting the common mode voltage error to obtain a corrected signal.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

What is claimed is:

1. An apparatus comprising:
   a plurality of analog front ends (AFEs);
   a plurality of analog-to-digital converters (ADCs), wherein each one of the plurality of ADCs is coupled to one corresponding AFE of the plurality of AFEs, and wherein the plurality of ADCs produce a plurality of digital signals;
   a plurality of digital channel registers, wherein each one of the plurality of digital channel registers is coupled to one corresponding ADC of the plurality of AFEs; and
   a processor coupled to at least one ADC and configured to adjust the plurality of digital signals based on a plurality of common mode voltage values and a plurality of common mode to differential gain values associated with the plurality of AFEs.

2. The apparatus of claim 1, wherein the processor is configured to update the common mode voltage values over a plurality of cycles in a round-robin calculation scheme.

3. The apparatus of claim 1 further comprising a memory, wherein a previously calculated version of the common mode to differential gain values are stored in the memory.

4. The apparatus of claim 1, wherein the plurality of ADCs comprise or are coupled to a plurality of dedicated registers.

5. The apparatus of claim 1, wherein the apparatus is part of a cell monitor unit coupled to a battery module, and wherein the battery module comprises the plurality of battery cells.

6. A cell monitor unit comprising:
a plurality of operational amplifiers (op-amps);
a multiplexer coupled to the plurality of op-amps;
an analog-to-digital converter (ADC) coupled to the multiplexer;
a demultiplexer coupled to the ADC;
a plurality of digital channel registers coupled to the demultiplexer; and
a processor coupled to the digital channel registers;
wherein a processor is configured to adjust a plurality of digital signals from the ADC based on a plurality of corresponding common mode voltage values and a plurality of precalculated common mode to differential gain values;
wherein the plurality of digital signals represent a plurality of decreased differential output voltages from the plurality of op-amps.

7. The cell monitor unit of claim 6, wherein the plurality of digital signals are stored in the plurality of digital channel registers.

8. The cell monitor unit claim 6, wherein the processor is configured to update the common mode voltage values over a plurality of cycles in round-robin calculation scheme.

9. An apparatus comprising:
at least one analog-to-digital converter (ADC), wherein the at least one ADC converts a plurality of differential voltages into a plurality of digital signals;
memory, wherein the memory stores a plurality of common mode voltage values corresponding to the plurality of differential voltages based on a plurality of previously obtained differential voltages;
a processor, wherein the processor determines a plurality of common mode voltage error values based on a plurality of common mode to differential gain values associated with analog front ends (AFEs) and the updated common mode voltage values; and
wherein the processor adjusts the plurality of digital signals according to the plurality of common mode voltage error values, wherein the steps of updating the plurality of common mode voltage values, calculating the plurality of common mode voltage error values, and adjusting the plurality of digital signals are repeated in a round-robin calculation scheme.

10. The apparatus of claim 9, wherein the previously obtained differential voltages comprise a plurality of differential output voltages associated with a plurality of battery cells, or a plurality of digital channel voltages corresponding to the digital signals.

11. The apparatus of claim 9, wherein the plurality of common mode to differential gain values and the plurality of common mode voltage values are digital values.

12. The apparatus of claim 9 wherein the plurality of AFEs decreases a plurality of output voltages from a plurality of battery cells to obtain the plurality of differential voltages.

13. The method of claim 12, wherein the plurality of digital signals is arranged in a plurality of digital channels corresponding to ascending levels of output voltages from the plurality of battery cells.

14. The method of claim 13, wherein the previously obtained voltages comprise a plurality of accumulated differential output voltages for the plurality of digital channels.

15. The method of claim 9, wherein the round-robin calculation scheme comprises a plurality of iterative calculation cycles.

* * * * *